(12) United States Patent
Cho et al.

(10) Patent No.: US 8,378,730 B2
(45) Date of Patent: Feb. 19, 2013

(54) CLOCK GENERATING CIRCUIT AND CLOCK GENERATING METHOD

(75) Inventors: Feng-Hsin Cho, Pingtung (TW); Kuo-Lin Chuang, Pingtung (TW)

(73) Assignee: Industrial Technology Research Institute, Hsinchu (TW)

( * ) Notice: Subject to any disclaimer, the term of this patent is extended or adjusted under 35 U.S.C. 154(b) by 123 days.

(21) Appl. No.: 13/093,396

(22) Filed: Apr. 25, 2011

(65) Prior Publication Data

US 2012/0161828 A1 Jun. 28, 2012

(30) Foreign Application Priority Data

Dec. 22, 2010 (TW) .............................. 99145154 A

(51) Int. Cl.
*G06F 1/04* (2006.01)

(52) U.S. Cl. ........ 327/291; 327/298; 327/512; 327/540; 323/313; 323/315

(58) Field of Classification Search .................. 327/291, 327/293, 295–298, 512, 513, 538–543; 323/312–315
See application file for complete search history.

(56) References Cited

U.S. PATENT DOCUMENTS

| 7,342,461 B1 | 3/2008 | Wood |
| 7,511,589 B2 | 3/2009 | Tarng |
| 7,525,392 B2 | 4/2009 | Tarng |
| 7,688,150 B2 * | 3/2010 | Kurd et al. ...................... 331/44 |
| 2007/0273453 A1 | 11/2007 | Maher |
| 2008/0042765 A1 | 2/2008 | Tarng et al. |
| 2008/0042766 A1 | 2/2008 | Tarng et al. |
| 2009/0066157 A1 | 3/2009 | Tarng et al. |

FOREIGN PATENT DOCUMENTS

| TW | 200605285 | 2/2006 |
| TW | 200612665 | 4/2006 |
| TW | 201015403 | 4/2010 |

OTHER PUBLICATIONS

Translation of Abstract of TW 200605285.
Translation of Abstract of TW 201015403.
"Process and Temperature Compensation in a 7-MHz CMOS Clock Oscillator"; Krishnakumar Sundaresan, Phillip E. Allen, and Farrokh Ayazi; IEEE Journal of Solid-State Circuits, vol. 41, No. 2, Feb. 2006, pp. 433-442.

(Continued)

*Primary Examiner* — An Luu
(74) *Attorney, Agent, or Firm* — Wang Law Firm, Inc.; Li K. Wang; Stephen Hsu

(57) ABSTRACT

A clock generation circuit is provided, having a bandgap reference circuit, a frequency controlled resistor, a comparison circuit and a voltage controlled oscillator. The bandgap reference circuit generates a first voltage. The frequency controlled resistor is coupled to a first node to provide a second voltage. The comparison circuit generates a first current according to a difference between the first voltage and the second voltage. The voltage controlled oscillator outputs first, second and third output clocks according to a third voltage on a second node, wherein the third voltage is generated according to the first current, and the second and third output clocks are fed back to the frequency controlled resistor such that the frequency controlled resistor converts the first current into the second voltage according to the second and third output clocks.

20 Claims, 8 Drawing Sheets

OTHER PUBLICATIONS

"A 30-MHz, 90-ppm/°C Fully-integrated Clock Reference Generator with Frequency-locked Loop"; Ken Ueno, Tetsuya Asai, and Yoshihito Amemiya; 2009

"A 0.5-to-480MHz Self-Referenced CMOS Clock Generator with 90ppm Total Frequency Error and Spread-Spectrum Capability"; Michael S. McCorquodale et al.; IEEE International Solid-State Circuits Conference; 2008.

* cited by examiner

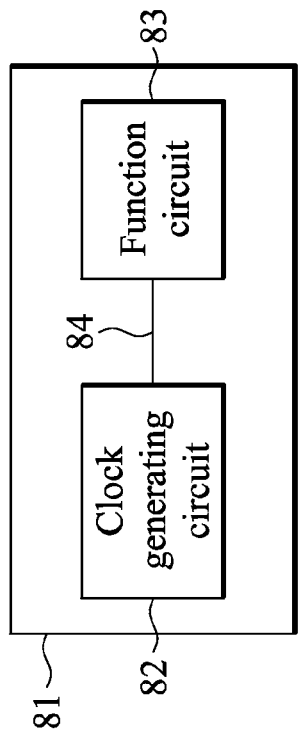
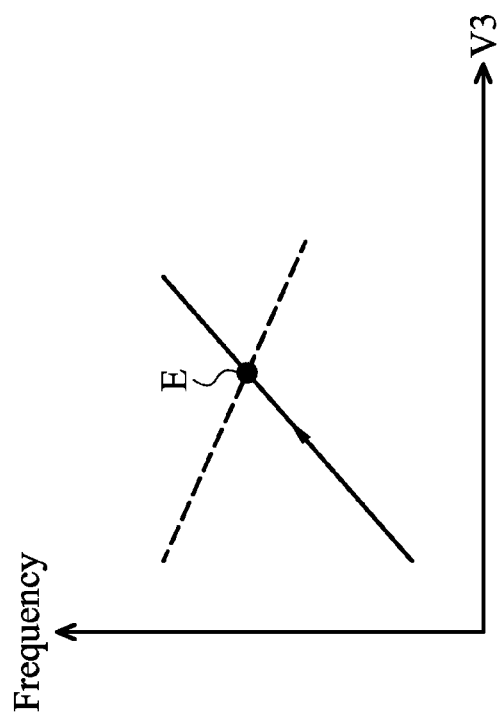
FIG. 8
FIG. 7

CLOCK GENERATING CIRCUIT AND CLOCK GENERATING METHOD

CROSS REFERENCE TO RELATED APPLICATIONS

This application claims priority of Taiwan Patent Application No. 099145154, filed on Dec. 22, 2010, the entirety of which is incorporated by reference herein.

BACKGROUND OF THE INVENTION

1. Field of the Invention

The disclosure relates to a clock generating circuit, and in particular relates to a clock generating circuit deposited in a chip.

2. Description of the Related Art

Recent system on a chip (SOC) designs often incorporate one, two or more "cores". These cores are popular processors such as digital signal processing processors (DSPs), advanced RISO machines (ARMs), reduced instruction set computers (RISCs) or microprocessors. However, the present SOC needs to provide an external reference clock to internal circuits of the SOC. Therefore, there is a need for a clock generating circuit deposited in the SOC to decrease design circuit complexity and costs.

BRIEF SUMMARY OF THE INVENTION

In light of the previously described problems, the disclosure provides an embodiment of a clock generation circuit, including a bandgap reference circuit, a frequency controlled resistor, a comparison circuit and a voltage controlled oscillator. The bandgap reference circuit generates a first voltage. The frequency controlled resistor is coupled to a first node to provide a second voltage. The comparison circuit generates a first current according to a difference between the first voltage and the second voltage. The voltage controlled oscillator outputs first, second and third output clocks according to a third voltage on a second node, in which the third voltage is generated according to the first current, and the second and third output clocks are fed back to the frequency controlled resistor such that the frequency controlled resistor converts the first current into the second voltage according to the second and third output clocks.

The disclosure also provides an embodiment of a chip, including a clock generating circuit and at least one function circuit. The clock generating circuit includes a bandgap reference circuit, a frequency controlled resistor, a comparison circuit and a voltage controlled oscillator. The bandgap reference circuit generates a first voltage. The frequency controlled resistor is coupled to a first node to provide a second voltage. The comparison circuit generates a first current according to a difference between the first voltage and the second voltage. The voltage controlled oscillator outputs first, second and third output clocks according to a third voltage on a second node, in which the third voltage is generated according to the first current, and the second and third output clocks are fed back to the frequency controlled resistor such that the frequency controlled resistor converts the first current into the second voltage according to the second and third output clocks. The function circuit is coupled to the clock generating circuit and performs a corresponding operation according to the first output clock.

The disclosure also provides a clock generating method. The clock generating method includes the steps of: generating a first current according to a difference between a first voltage output from a bandgap reference circuit and a second voltage output from a frequency controlled resistor; generating a third voltage according to the first current to control a voltage controlled oscillator, thereby providing a plurality of output clocks having the same frequency and different phases, in which two of the output clocks are output to the frequency controlled resistor; and adjusting the resistance of the frequency controlled resistor according to the two output clocks received by the frequency controlled resistor, thereby compensating for frequency drift of the output clocks caused by power variation.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein:

FIG. 7 shows the relationship between the output clock and the voltage V3;

FIG. 8 illustrates an embodiment of the chip of the disclosure; and

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
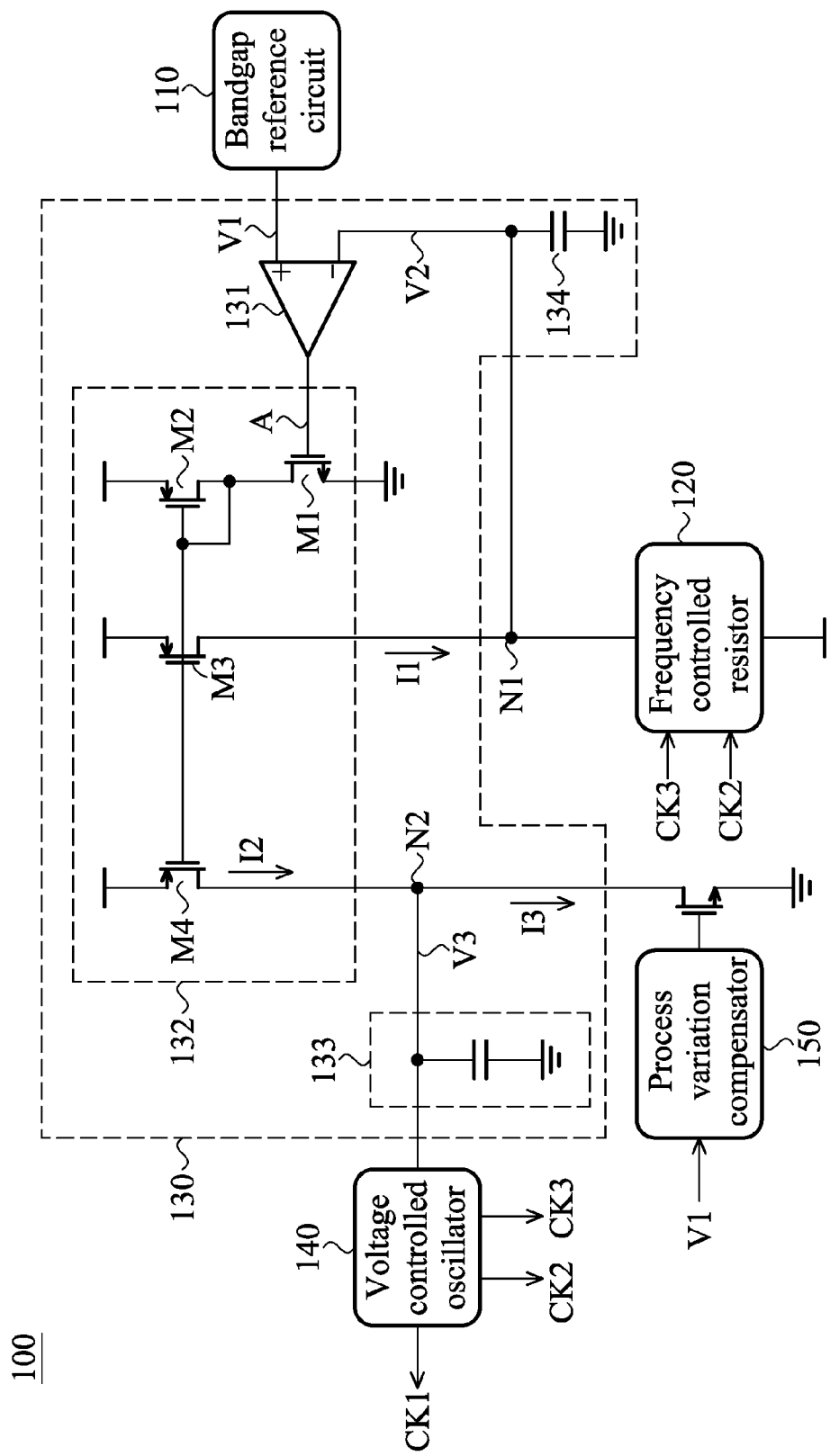
FIG. 1 illustrates an embodiment of the clock generating circuit of the disclosure.

FIG. 1 illustrates an embodiment of the clock generating circuit of the disclosure. As shown in FIG. 1, a clock generating circuit 100 comprises a bandgap reference circuit 110, a frequency controlled resistor 120, a comparison circuit 130, a voltage controlled oscillator 140 and a process variation compensator 150, wherein the process variation compensator 150 can be optional. For example, the bandgap reference circuit 110 generates a voltage V1, wherein the voltage V1 is temperature-independent. The frequency controlled resistor 120 is coupled to a node N1 and provides a voltage V2 to the comparison circuit 130 according to output clocks CK2 and CK3 output from the voltage controlled oscillator 140. The comparison circuit 130 respectively generates a current I1 and a current I2 to the node N1 and a node N2 according to the difference between the voltage V1 and voltage V2, wherein the current I2 is the mirror current of the current I1. In some embodiments, the current I2 is a certain percentage of the current I1. In this embodiment, the current I2 is the same as the current I1. The voltage controlled oscillator 140 outputs the output clocks CK1, CK2 and CK3 according to a voltage V3 on the node N2, wherein the voltage V3 is generated according to the difference between the current I2 and the current I3 and the output clocks CK2 and CK3 are fed back to the frequency controlled resistor 120, such that the frequency controlled resistor 120 adjusts its resistance and converts the current I1 into the voltage V2. In addition, the process variation compensator 150 extracts a current I3 from the current I2 to control the voltage V3 according to the voltage V1, thereby compensating for process variation.

In this embodiment, the phase difference between the output clock CK2 and the output clock CK3 is 180°. The phase of the output clock CK1 can be the same as the phase of the output clock CK2 or the phase of the output clock CK3. In some embodiments, the phase of the output clock CK1 can be different from the phase of the output clock CK2 or the phase of the output clock CK3, but is not limited thereto. In addition, in this embodiment, the voltage controlled oscillator 140 is a negative-slope voltage controlled oscillator, but is not limited thereto.

In this embodiment, the comparison circuit 130 comprises a comparator 131, a current mirror 132 and a current to voltage converter 133. For example, the comparator 131 has a first terminal receiving the voltage V1, a second terminal receiving the voltage V2 and an output terminal outputting a comparison signal A. According to the comparison signal A, the current mirror 132 outputs the current I1 to the frequency controlled resistor 120 and outputs the current I2 to the node N2, wherein the current I2 is the mirror current of the current I1. The current to voltage converter 133 is coupled to the node N2 and generates the voltage V3 according to the difference between the current I2 and the current I3. In some embodiments, the current to voltage converter 133 can be a capacitor, but is not limited thereto. In this embodiment, the comparison circuit 130 further comprises a voltage stabilizer 134. The voltage stabilizer 134 can be implemented as a capacitor for stabilizing voltages, but is not limited thereto. The current mirror 132 comprises transistors M1, M2, M3 and M4, wherein the transistor M1 serves as the controller of the current mirror 132 to control the current I1 and the current I2. The transistors M2, M3 and M4 generate the current I1 and the current I2.

Figure 2:
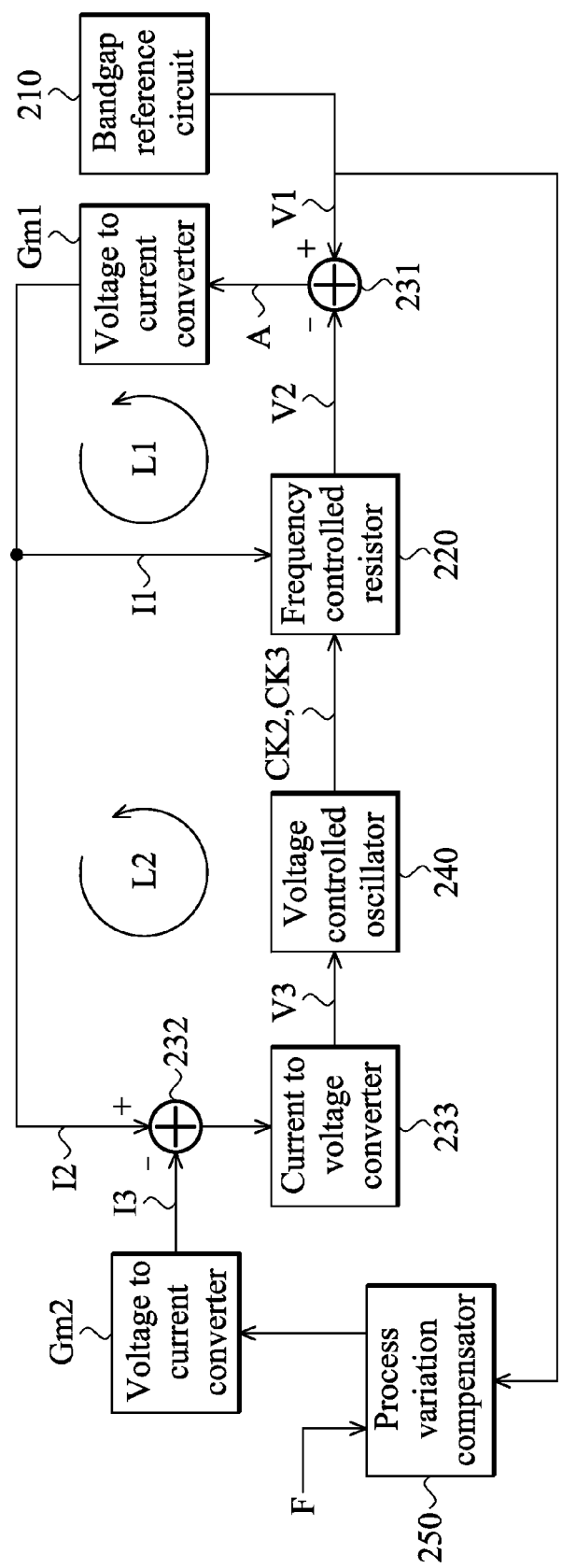
FIG. 2 illustrates an equivalent circuit diagram of the clock generating circuit of the disclosure to describe the clock generating circuit 100 of FIG. 1.

The clock generating circuit of the disclosure has the advantage of having two feedback loops. FIG. 2 illustrates an equivalent circuit diagram of the clock generating circuit of the disclosure to describe the clock generating circuit 100 of FIG. 1. As shown in FIG. 2, a bandgap reference circuit 210 generates the voltage V1 temperature-independent. A comparator 231 compares the difference between the voltage V1 and the voltage V2 generated from a frequency controlled resistor 220 to output a comparison signal A to a voltage to current converter Gm1, wherein the voltage to current converter Gm1 corresponds to the current mirror 132 of FIG. 1. The voltage to current converter Gm1 outputs the current I1 to the frequency controlled resistor 220 according to the comparison signal A. The frequency controlled resistor 220 outputs the voltage V2 to the comparator 231 according to the current I1, such that a feedback loop L1 is composed. When the voltage variation is generated in the voltage V1 output from the bandgap reference circuit 210, the voltage variation can be compensated for by the feedback loop L1. In addition, the voltage to current converter Gm1 also outputs the current I2 to a comparison unit 232, wherein the comparison unit 232 can be implemented as the node N2 of FIG. 1. The current I2 is the mirror current of the current I1. A current to voltage converter 233 outputs a voltage V3 to a voltage controlled oscillator 240 according to the current I2 and the current I3 output from the voltage to current converter Gm2. The voltage controlled oscillator 240 outputs the output clock CK2 and the output clock CK3 to the frequency controlled resistor 220 according to the voltage V3, such that a feedback loop L2 is composed. When the voltage variation is generated in the output clock CK1, the frequency variation can be compensated for by the feedback loop L2. In addition, a process variation compensator 250 is biased by the voltage V1. The current I3 is extracted from the current I2 by the voltage to current converter Gm2 and comparison unit 232 to control the voltage V3, thereby compensating for the process variation. In some embodiments, the process variation compensator 250 can be optional. In this embodiment, the current to voltage converter 233 generates the voltage V3 according to the difference between the current I2 and the current I3 output from the voltage to current converter Gm2, but is not limited thereto. In this embodiment, the voltage variation is caused by the voltage drift of the power.

Figure 3:
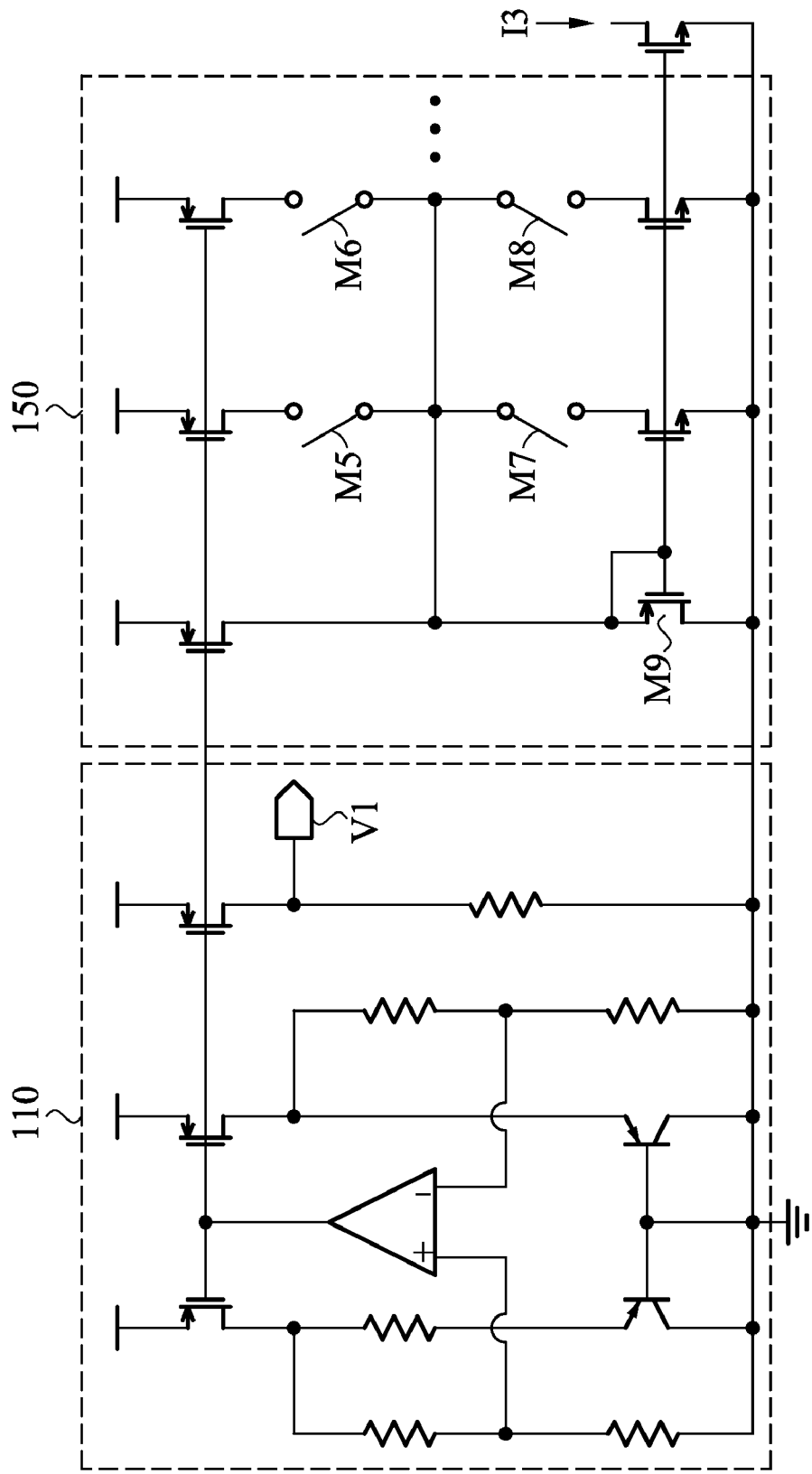
FIG. 3 illustrates an embodiment of the bandgap reference circuit and the process variation compensator of the disclosure.

FIG. 3 illustrates an embodiment of the bandgap reference circuit and the process variation compensator of the disclosure. As shown in FIG. 3, the bandgap reference circuit 110 generates the voltage V1 temperature-independent and provides the voltage V1 to the process variation compensator 150. In this embodiment, the process variation compensator 150 determines the magnitude of the current I3 by the switching devices M5, M6, M7 and M8 to control the voltage V3, wherein the current I3 is extracted from the current I2. For example, when the switching device M5 is turned on, the current flowing through a transistor M9 is increased, such that the current I3 is increased. Therefore, the voltage V3 is adjusted to compensate for process variation. When the switching devices M5 and M6 are turned on at the same time, the current I3 is increased even more. On the contrary, when the switching device M7 is turned on, the current flowing through a transistor M9 is decreased, such that the current I3 is decreased. Similarly, when the switching devices M7 and M8 are turned on at the same time, the current I3 is decreased even more. In addition, the switching devices M5, M6, M7 and M8 are controlled by a signal F as shown in FIG. 2. For example, I3=K×I, wherein I is a value of the current output from the bandgap reference circuit 110. K is a factor dependent on the process. In some embodiments, the bit number of the switching devices is determined by the frequency drift caused by process variation.

Figure 4:
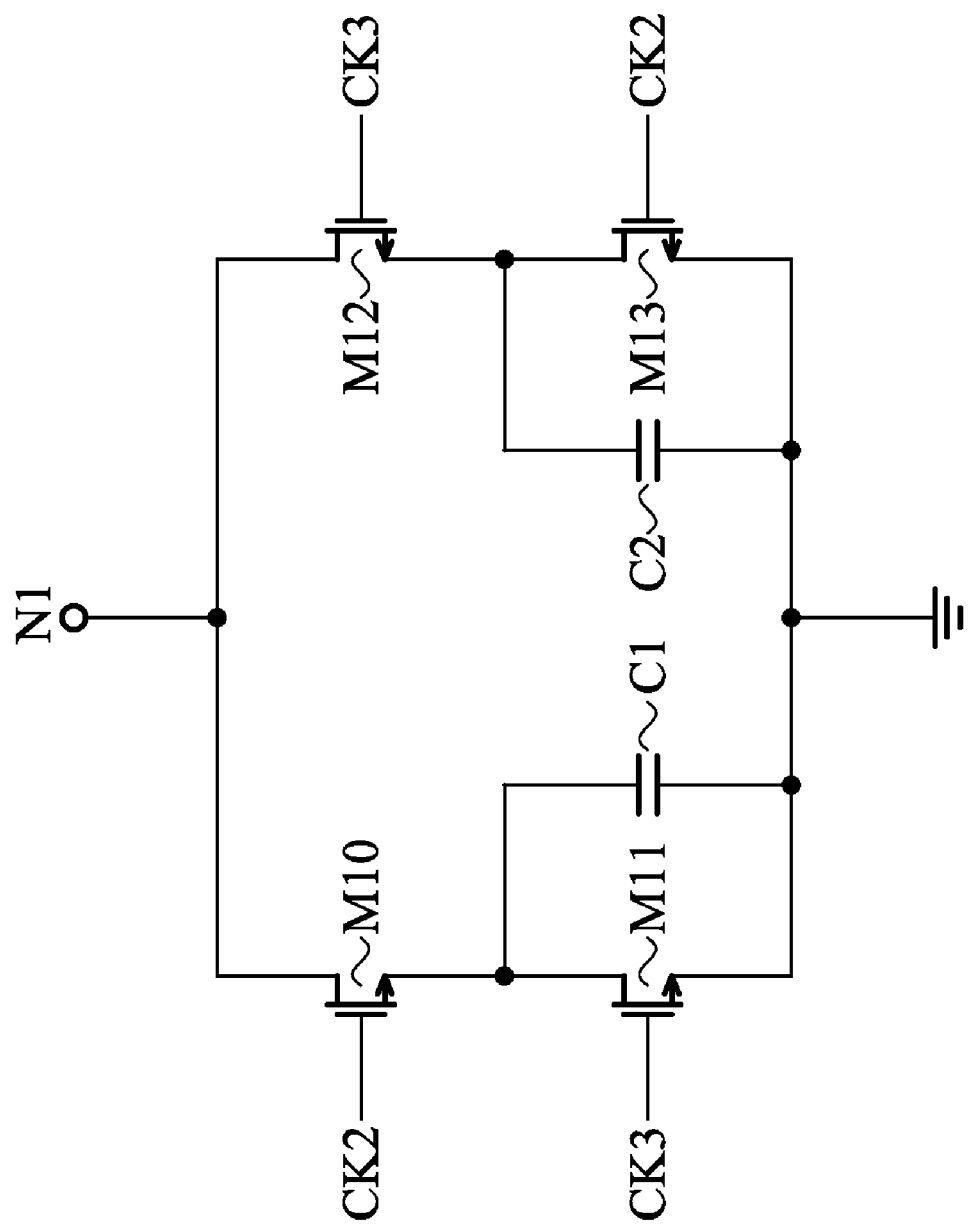
FIG. 4 illustrates an embodiment of the frequency controlled resistor of the disclosure.

FIG. 4 illustrates an embodiment of the frequency controlled resistor of the disclosure. As shown in FIG. 4, the frequency controlled resistor 120 has transistors M10, M11, M12 and M13 and capacitors C1 and C2, wherein the output clock CK2 is output to the gates of the transistors M10 and M13, and the output clock CK3 is output to the gates of the transistors M11 and M12, thereby adjusting the resistance of the frequency controlled resistor 120. The phases of the output clocks CK2 and CK3 are inverse and non-overlap (i.e., the phase difference is 180°). The resistance of the frequency controlled resistor 120 is in inverse proportion to the frequency of the output clocks CK2 and CK3. For example, R=1/FC, wherein R is the resistance of the frequency controlled resistor 120, F is the frequency of the output clocks CK2 and CK3, and C is the capacitance of the capacitors C1 and C2.

Figure 5:
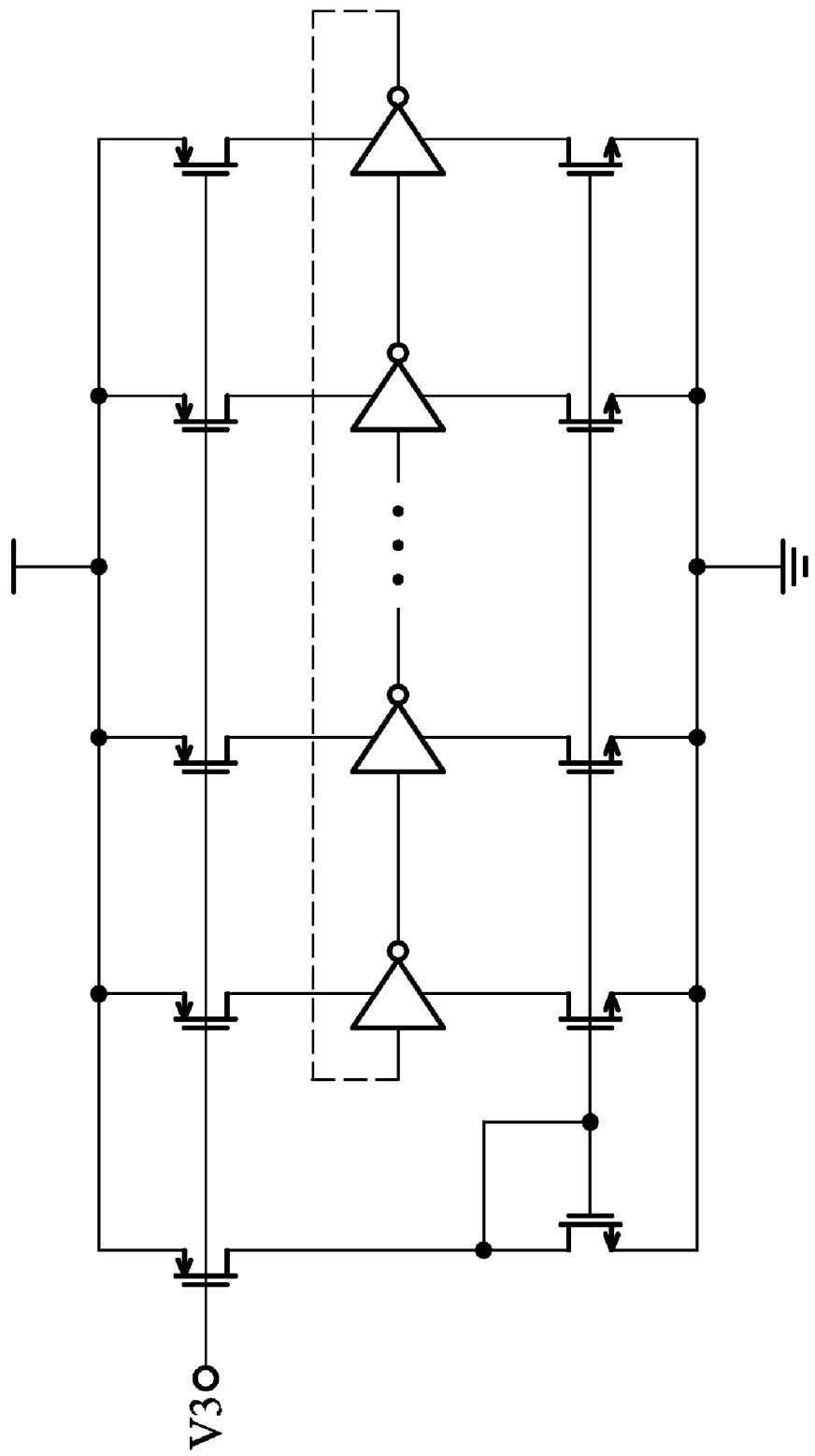
FIG. 5 illustrates an embodiment of the voltage controlled oscillator of the disclosure.

FIG. 5 illustrates an embodiment of the voltage controlled oscillator of the disclosure. As shown in FIG. 5, the voltage controlled oscillator 140 has a plurality of inverters to generate a plurality of output clocks in different phases. The number of the inverters is odd. For example, the output clocks CK1, CK2 and CK3 are generated, wherein the phase difference between the output clocks CK2 and CK3 is 180°, and the output clock CK1 can be one of the output clocks CK2 and CK3. In some embodiments, the output clock CK1 can be different from the output clocks CK2 and CK3.

Figure 6:
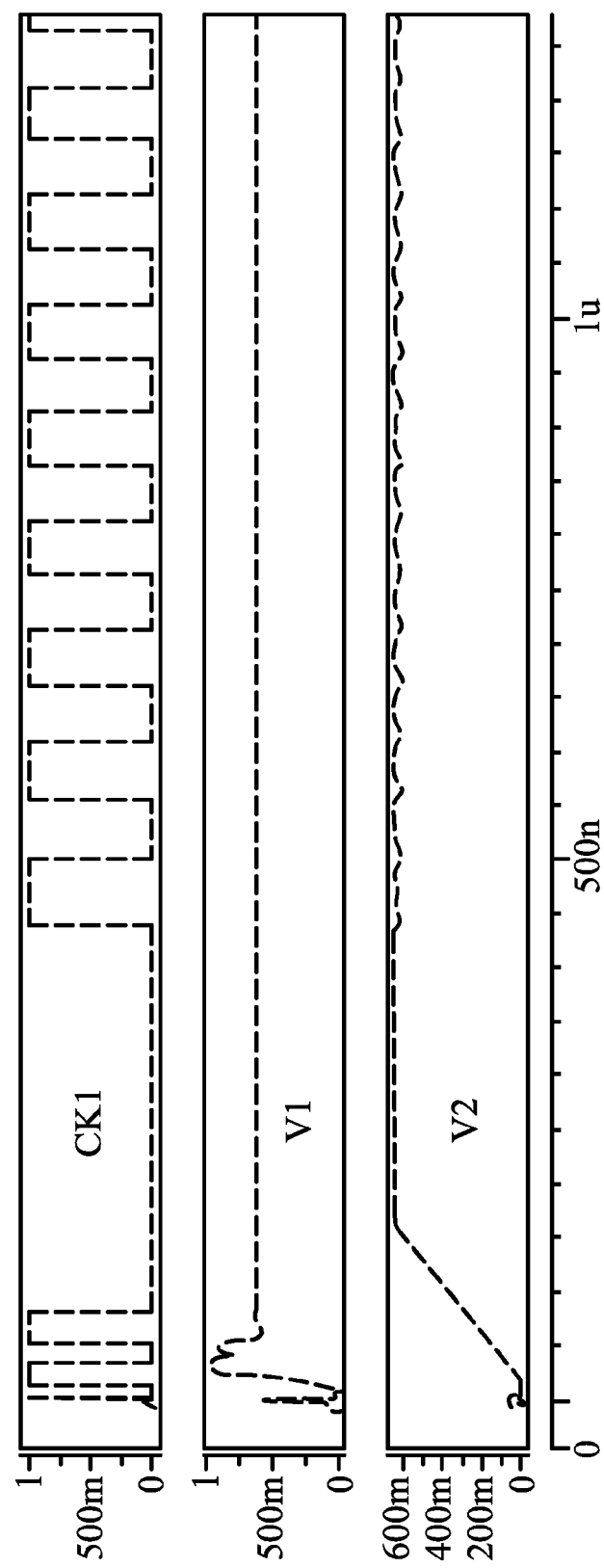
FIG. 6 illustrates a waveform of the clock generating circuit of the disclosure.

FIG. 6 illustrates a waveform of the clock generating circuit of the disclosure. As shown in FIG. 6, when the voltage V2 approaches to the voltage V1, the output clock CK1 is gradually stabilized at 500 ns. Therefore, the output clock CK1 can serve as the reference clock in a chip.

FIG. 7 shows the relationship between the output clock and the voltage V3. As shown in FIG. 7, the solid line is the relationship curve between the frequency of the output clock CK1 and the voltage V3. The dashed line is the gain curve of the voltage controlled oscillator 140. As shown in FIG. 7, the frequency of the output clock CK1 and the voltage V3 are in dynamic equilibrium on a point E. The point E is an intersection point of two curves, wherein one curve is the gain curve of the voltage controlled oscillator 140 and the other curve is the relationship curve between the frequency of the output clock CK1 and the voltage V3.

FIG. 8 illustrates an embodiment of the chip of the disclosure. As shown in FIG. 8, a chip 81 has a clock generating circuit 82 and a function circuit 83, wherein the clock generating circuit 82 can be implemented by the clock generating circuit 100. The function circuit 83 can be a memory circuit, a phase-locked loop circuit, a delay-looked loop circuit, an analog circuit or a digital circuit, but is not limited thereto. The clock generating circuit 82 outputs an output clock 84 to the function circuit, thus, the chip 81 does not need a clock output from an external clock generating circuit.

Figure 9:
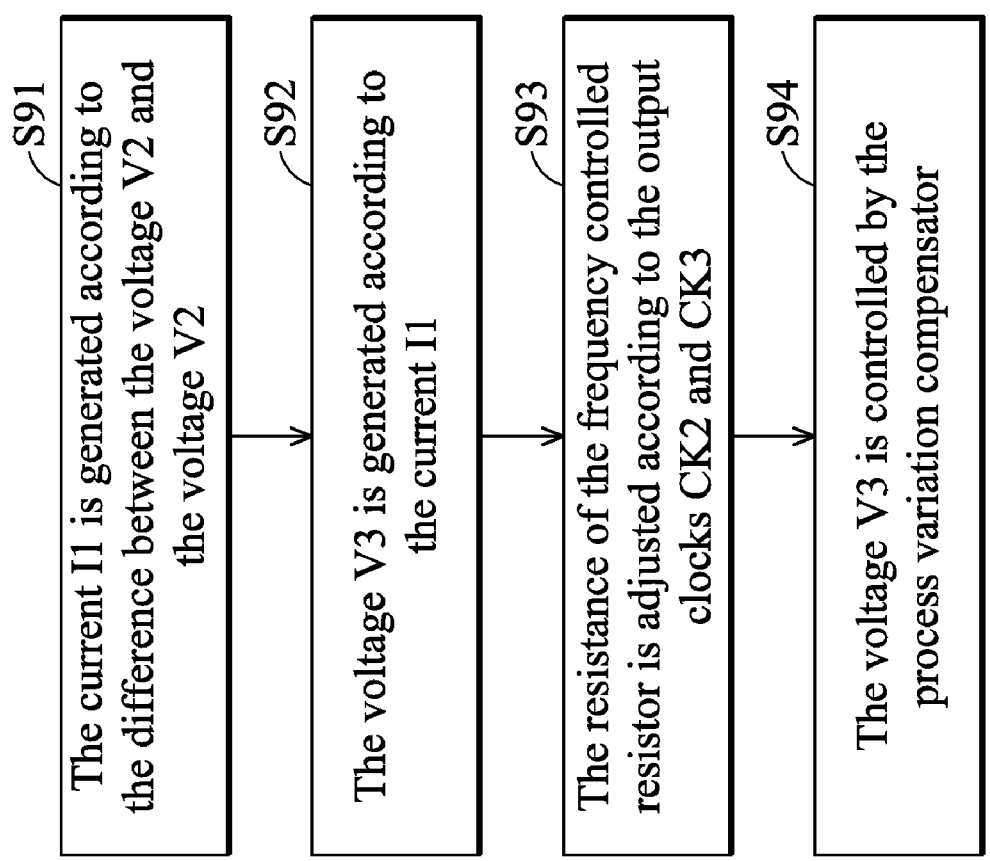
FIG. 9 illustrates a flowchart of the clock generating method of the disclosure.

FIG. 9 illustrates a flowchart of the clock generating method of the disclosure. As shown in FIG. 9, the clock generating method includes the following steps.

In step S91, the current I1 is generated according to the difference between the voltage V2 output from a bandgap reference circuit 110 and the voltage V2 output from the frequency controlled resistor 120. In step S92, the voltage V3 is generated according to the current I1 to control the voltage controlled oscillator 140, thereby providing a plurality of output clocks having the same frequency and different phases, wherein one of the output clocks is output to the load and two of the output clocks are output to the frequency controlled resistor 120. In step S93, the resistance of the frequency controlled resistor 120 is adjusted according to the two output clocks received by the frequency controlled resistor 120, thereby compensating for frequency drift of the output clocks caused by power variation. In step S94, the voltage V3 is controlled by the process variation compensator 150, thereby compensating for frequency drift of the output clock caused by process variation. The loading can be a memory circuit, a phase-locked loop circuit, a delay-looked loop circuit, an analog circuit or a digital circuit, but is not limited thereto.

In general, the clock generating circuit 100 of the disclosure has the bandgap reference circuit 100, such that the output clock generated by the clock generating circuit 100 is temperature-independent. Moreover, the clock generating circuit 100 has the feedback loop circuits L1 and L2 to compensate for the voltage variation and the frequency variation. Therefore, the clock generating circuit 100 of the disclosure has an advantage of compensating for process variation, voltage variation and temperature variation. Moreover, the clock generating circuit 100 is normally operated with 1 volt, thus, the clock generating circuit 100 can be deposited in the chip 81, such that the chip 81 does not need an external reference clock.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A clock generation circuit, comprising:
   a bandgap reference circuit, generating a first voltage;
   a frequency controlled resistor, coupled to a first node to provide a second voltage;
   a comparison circuit, generating a first current according to a difference between the first voltage and the second voltage; and
   a voltage controlled oscillator, outputting first, second and third output clocks according to a third voltage on a second node, wherein the third voltage is generated according to the first current, and the second and third output clocks are fed back to the frequency controlled resistor such that the frequency controlled resistor converts the first current into the second voltage according to the second and third output clocks.

2. The clock generating circuit as claimed in claim 1, further comprising:
   a process variation compensator, extracting a second current from the second node to control the third voltage according to the first voltage, thereby compensating for process variation.

3. The clock generating circuit as claimed in claim 1, wherein the comparison circuit comprises:
   a comparator, having a first input terminal receiving the first voltage, a second input terminal receiving the second voltage and an output terminal outputting a comparison signal;
   a current mirror, outputting the first current to the frequency controlled resistor and a second current to the second node according to the comparison signal, wherein the second current is the mirror current of the first current; and
   a current to voltage converter, coupled to the second node to generate the third voltage according to the second current.

4. The clock generating circuit as claimed in claim 3, wherein the current to voltage converter is a capacitor.

5. The clock generating circuit as claimed in claim 1, wherein a phase difference between the second output clock and the third output clock is 180°.

6. The clock generating circuit as claimed in claim 3, wherein the comparison circuit further comprises a voltage stabilizer coupled to the first node to stabilize the second voltage.

7. The clock generating circuit as claimed in claim 6, wherein the voltage stabilizer is a capacitor for stabilizing voltage.

8. The clock generating circuit as claimed in claim 1, wherein the resistance of the frequency controlled resistor is in inverse proportion to the frequency of the first output clock.

9. A chip, comprising:
   a clock generating circuit, comprising:
      a bandgap reference circuit, generating a first voltage;
      a frequency controlled resistor, coupled to a first node to provide a second voltage;
      a comparison circuit, generating a first current according to a difference between the first voltage and the second voltage; and
      a voltage controlled oscillator, outputting first, second and third output clocks according to a third voltage on a second node, wherein the third voltage is generated according to the first current, and the second and third output clocks are fed back to the frequency controlled resistor such that the frequency controlled resistor converts the first current into the second voltage according to the second and third output clocks; and at least one function circuit, coupled to the clock generating circuit and performing a corresponding operation according to the first output clock.

10. The chip as claimed in claim 9, wherein the function circuit is a memory circuit, a phase-locked loop circuit, a delay-locked loop circuit, a digital circuit or an analog circuit.

11. The chip as claimed in claim 9, wherein the clock generating circuit further comprises a process variation compensator, extracting a second current from the second node to control the third voltage according to the first voltage, thereby compensating for process variation.

12. The chip as claimed in claim 9, wherein the comparison circuit comprises:
a comparator, having a first input terminal receiving the first voltage, a second input terminal receiving the second voltage and an output terminal outputting a comparison signal;
a current mirror, outputting the first current to the frequency controlled resistor; and
a current to voltage converter, coupled to the second node to generate the third voltage according to the second current.

13. The chip as claimed in claim 12, wherein the comparison circuit further comprises a voltage stabilizer, stabilizing the second voltage.

14. The chip as claimed in claim 9, wherein a phase difference between the second output clock and the third output clock is 180°.

15. The chip as claimed in claim 9, wherein the resistance of the frequency controlled resistor is in the inverse proportion to the frequency of the first output clock.

16. A clock generating method, comprising:
generating a first current according to a difference between a first voltage output from a bandgap reference circuit and a second voltage output from a frequency controlled resistor;
generating a third voltage according to the first current to control a voltage controlled oscillator, thereby providing a plurality of output clocks having the same frequency and different phases, wherein two of the output clocks are output to the frequency controlled resistor; and
adjusting the resistance of the frequency controlled resistor according to the two output clocks received by the frequency controlled resistor, thereby compensating for frequency drift of the output clocks caused by power variation.

17. The clock generating method as claimed in claim 16, wherein a phase difference between the two output clocks received by the frequency controlled resistor is 180°.

18. The clock generating method as claimed in claim 16, wherein the resistance of the frequency controlled resistor is in inverse proportion to the frequency of the output clocks.

19. The clock generating method as claimed in claim 16, further comprising:
controlling the third voltage by a process variation compensator, thereby compensating for frequency drift of the output clocks caused by process variation.

20. The clock generating method as claimed in claim 16, wherein the voltage controlled oscillator is a negative-slope voltage controlled oscillator.

* * * * *